US012751321B2

(12) United States Patent
Kweon

(10) Patent No.: US 12,751,321 B2
(45) Date of Patent: Sep. 29, 2026

(54) ELECTRONIC DEVICES AND METHODS OF MANUFACTURING ELECTRONIC DEVICES

(71) Applicant: Amkor Technology Singapore Holding Pte. Ltd., Valley Point (SG)

(72) Inventor: Young Do Kweon, Chandler, AZ (US)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 785 days.

(21) Appl. No.: 17/853,776

(22) Filed: Jun. 29, 2022

(65) Prior Publication Data

US 2024/0006393 A1 Jan. 4, 2024

(51) Int. Cl.
*H10W 90/00* (2026.01)
*H10W 40/00* (2026.01)
(Continued)

(52) U.S. Cl.
CPC ......... *H10W 90/00* (2026.01); *H10W 40/037* (2026.01); *H10W 40/251* (2026.01); (Continued)

(58) Field of Classification Search
CPC ............ H01L 23/3737; H01L 23/3736; H01L 23/49827; H01L 25/0655; H01L 23/3107; H01L 25/165; H01L 21/56; H01L 23/552; H01L 23/562; H01L 21/4882; H01L 24/32; H01L 2224/26145; H01L 2224/83051; H01L 2924/1659; H01L 2924/165; H01L 2924/1632; H01L 2924/162; H01L 2924/16315; H01L 2924/1631;
(Continued)

(56) References Cited

U.S. PATENT DOCUMENTS 8,981,550 B2 3/2015 Park et al.
9,892,990 B1 2/2018 Galloway et al.
(Continued)

*Primary Examiner* — Dale E Page
*Assistant Examiner* — Genevieve G Bullard-Connor
(74) *Attorney, Agent, or Firm* — Kevin B. Jackson

(57) ABSTRACT

In one example, an electronic device includes a substrate having a substrate top side, a substrate bottom side opposite to the substrate top side. A first electronic component is connected to the substrate top side and having a first electronic component top side distal to the substrate top side. A second electronic is connected to the substrate top side, laterally spaced apart from the first electronic component, and having a second electronic component top side distal to the substrate top side. A lid is connected to the substrate top side, covering the first electronic component and the second electronic component. The lid includes a lid ceiling; and a lid wall extending from the lid ceiling and defining a lid periphery. A dam structure is connected to the first electronic device top side and the lid ceiling within the lid periphery and having a vent. A first interface material is over the first electronic component top side and contained within the dam structure. A second interface material is over the second electronic component top side and connected to the lid ceiling, where the dam structure separates the first interface material from the second interface material. The first interface material has a higher thermal conductivity than the second interface material. Other examples and related methods are also disclosed herein.

20 Claims, 10 Drawing Sheets

(51) Int. Cl.

| | |
|---|---|
| ***H10W 40/25*** | (2026.01) |
| ***H10W 40/77*** | (2026.01) |
| ***H10W 72/00*** | (2026.01) |
| ***H10W 72/30*** | (2026.01) |
| ***H10W 74/15*** | (2026.01) |
| ***H10W 76/12*** | (2026.01) |
| ***H10W 76/60*** | (2026.01) |
| ***H10W 76/63*** | (2026.01) |
| ***H10W 76/67*** | (2026.01) |

(52) U.S. Cl.

CPC ......... *H10W 40/258* (2026.01); *H10W 40/77* (2026.01); *H10W 72/07338* (2026.01); *H10W 72/387* (2026.01); *H10W 74/15* (2026.01); *H10W 76/12* (2026.01); *H10W 76/60* (2026.01); *H10W 76/63* (2026.01); *H10W 76/67* (2026.01); *H10W 90/724* (2026.01); *H10W 90/734* (2026.01)

(58) Field of Classification Search

CPC . H01L 2924/16251; H01L 2924/16235; H01L 2924/15311; H01L 2924/1616; H01L 25/16; H01L 23/04; H01L 23/433; H01L 2224/73204; H01L 2224/32225; H01L 2224/16237; H01L 2224/16227; H01L 24/73; H01L 24/16; H10W 40/037; H10W 40/251; H10W 40/258; H10W 40/77; H10W 72/07338; H10W 72/387; H10W 74/15; H10W 76/12; H10W 76/60; H10W 76/63; H10W 76/67; H10W 90/00; H10W 90/724; H10W 90/734

See application file for complete search history.

(56) References Cited

U.S. PATENT DOCUMENTS

| | | | | |
|---|---|---|---|---|
| 11,152,282 | B1 * | 10/2021 | Arvin | H10W 40/70 |
| 11,621,211 | B2 * | 4/2023 | Hsieh | H10W 40/10<br>257/717 |
| 12,072,266 | B2 * | 8/2024 | Cheung | G01M 3/165 |
| 12,094,792 | B2 * | 9/2024 | Wang | H10W 42/121 |
| 2004/0262766 | A1 * | 12/2004 | Houle | H10W 40/22<br>257/E23.087 |
| 2006/0118925 | A1 * | 6/2006 | Macris | H10W 76/48<br>257/667 |
| 2007/0127211 | A1 * | 6/2007 | Macris | H10W 40/70<br>257/E23.09 |
| 2008/0137300 | A1 * | 6/2008 | Macris | H10W 40/70<br>257/E23.09 |
| 2009/0283034 | A1 * | 11/2009 | Natsuhara | H01L 21/68757<br>118/500 |
| 2017/0047261 | A1 * | 2/2017 | Lu | H01L 25/105 |
| 2018/0374714 | A1 * | 12/2018 | Stathakis | H10W 40/25 |
| 2019/0221498 | A1 * | 7/2019 | Wu | H10W 40/70 |
| 2020/0161275 | A1 * | 5/2020 | Lin | H10W 70/611 |
| 2020/0219786 | A1 * | 7/2020 | Hung | H10W 40/22 |
| 2020/0227336 | A1 * | 7/2020 | Eid | H10W 40/22 |
| 2020/0373220 | A1 * | 11/2020 | Chan Arguedas | H10W 40/70 |
| 2021/0098332 | A1 * | 4/2021 | Wang | H10W 40/255 |
| 2022/0344297 | A1 * | 10/2022 | Chee | H10W 40/22 |
| 2023/0021005 | A1 * | 1/2023 | Chiou | H10W 40/22 |
| 2023/0048302 | A1 * | 2/2023 | Hsieh | H10W 40/22 |
| 2023/0197667 | A1 * | 6/2023 | Li | H10W 40/25<br>257/734 |
| 2023/0378017 | A1 * | 11/2023 | Hsieh | H10W 40/22 |
| 2023/0395461 | A1 * | 12/2023 | Lin | H10W 40/70 |
| 2024/0222309 | A1 * | 7/2024 | Park | H10W 72/30 |

* cited by examiner

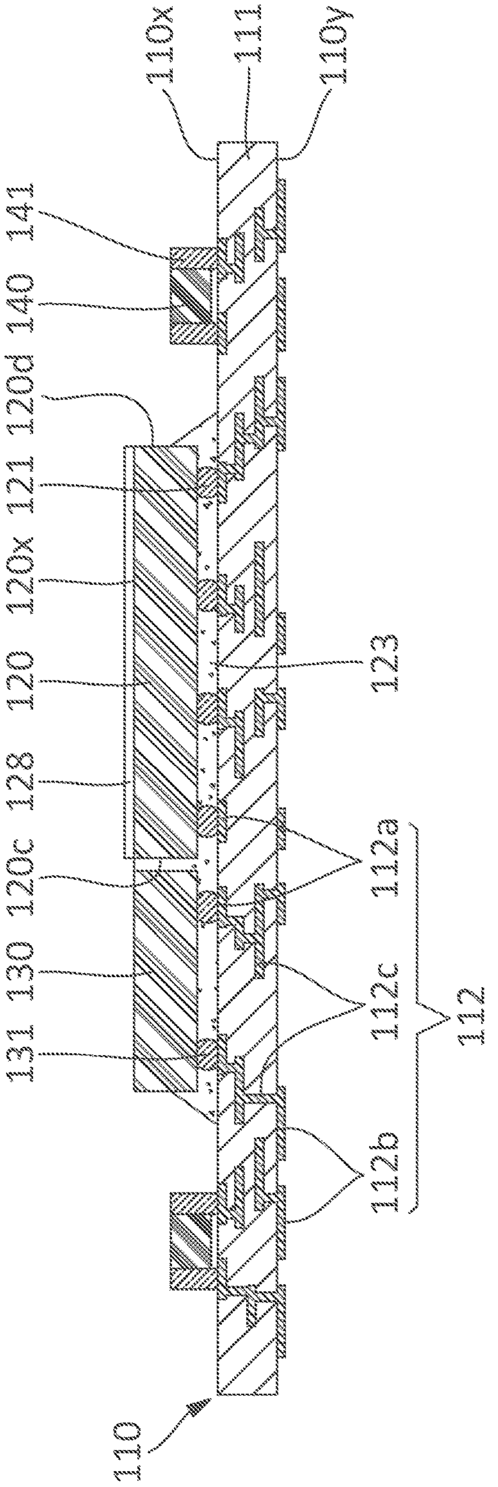
FIG.2B-A
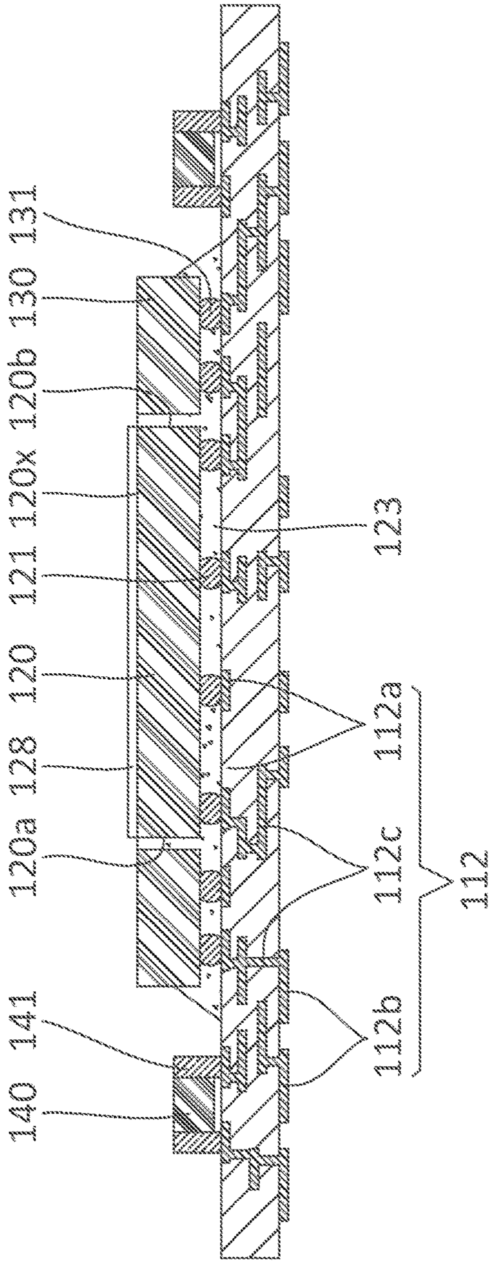
FIG.2B-B

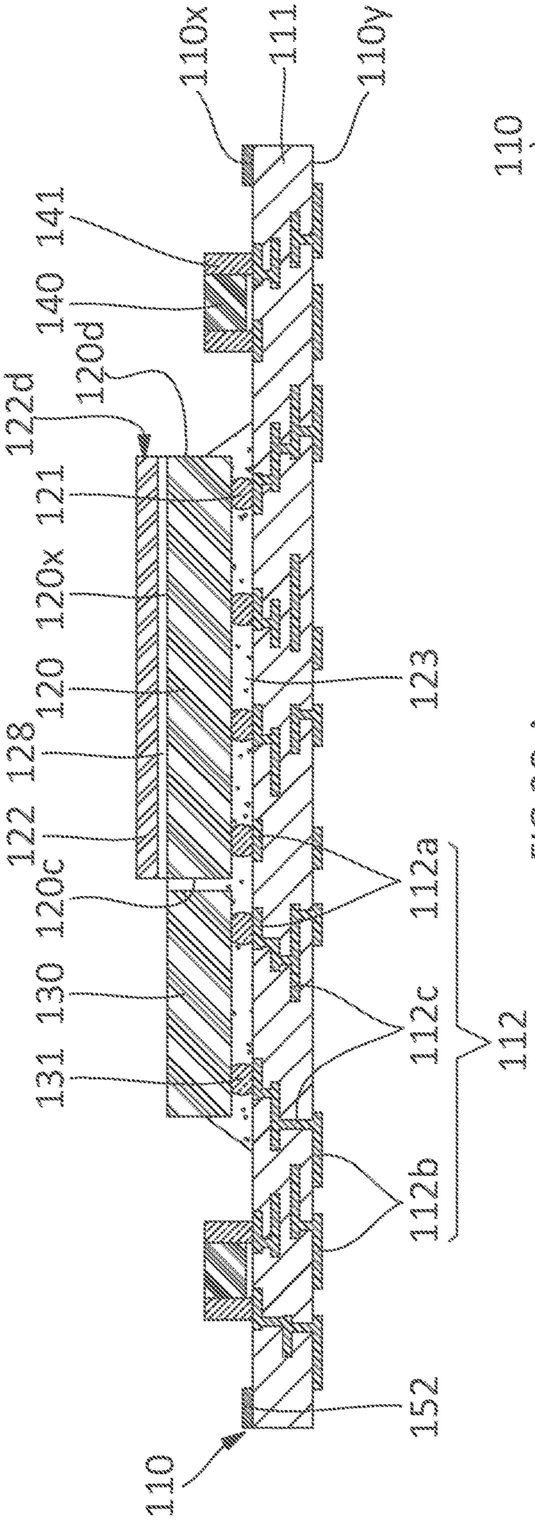
FIG.2C-A
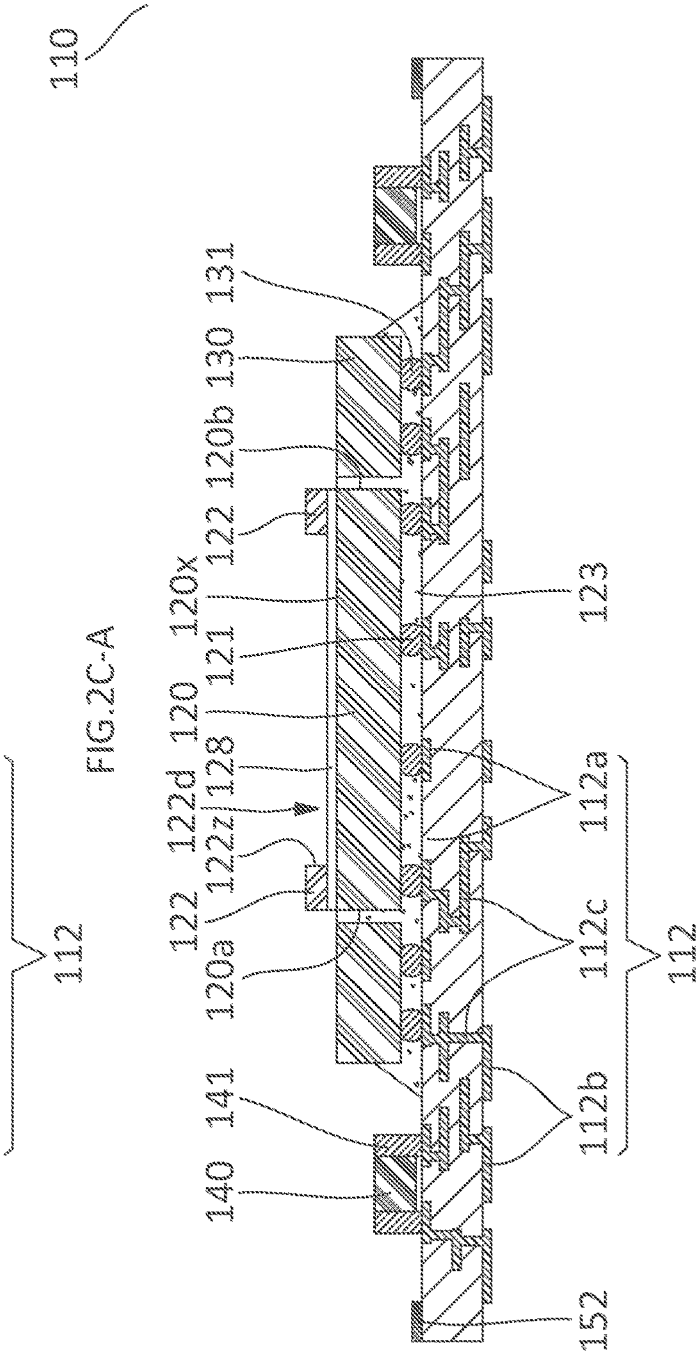
FIG.2C-B

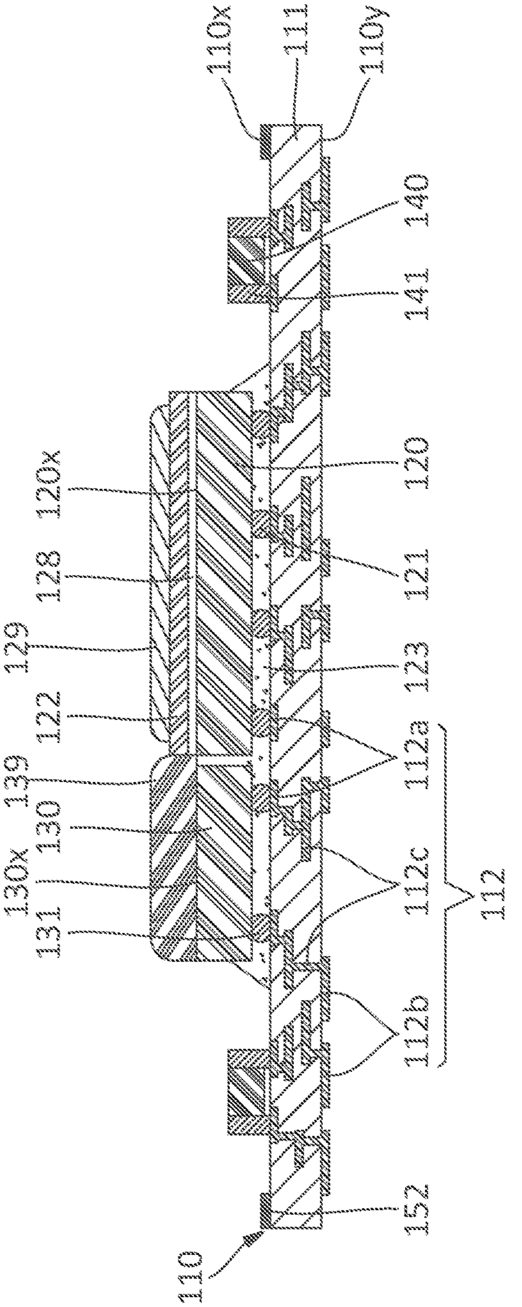
FIG.2D-A
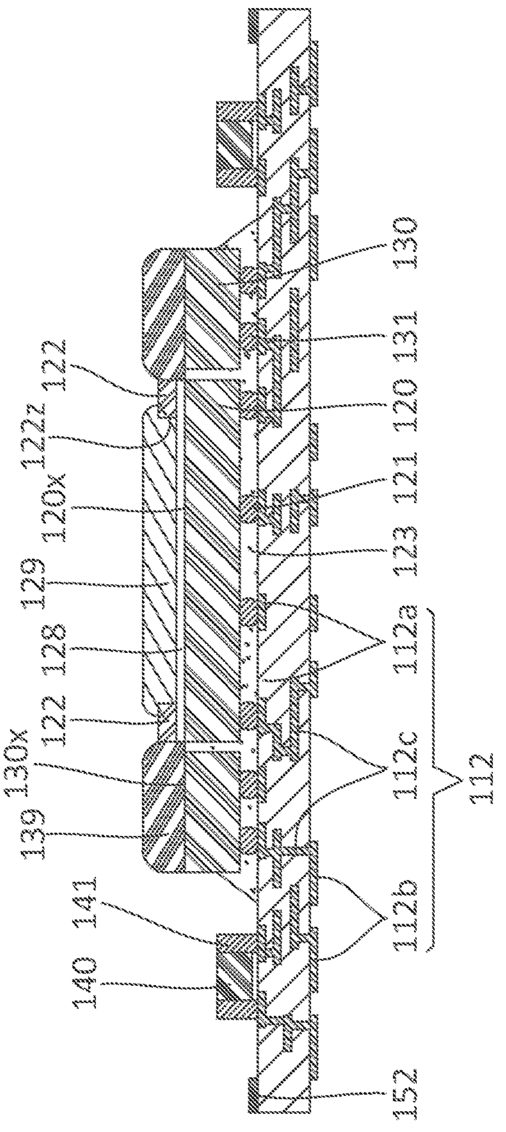
FIG.2D-B

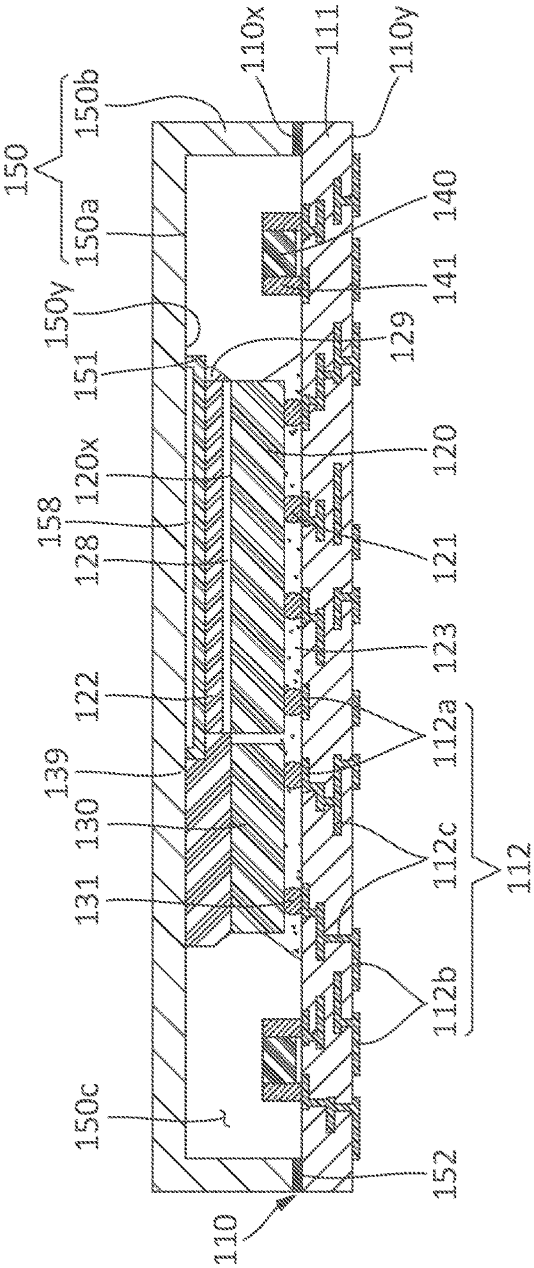
FIG.2E-A
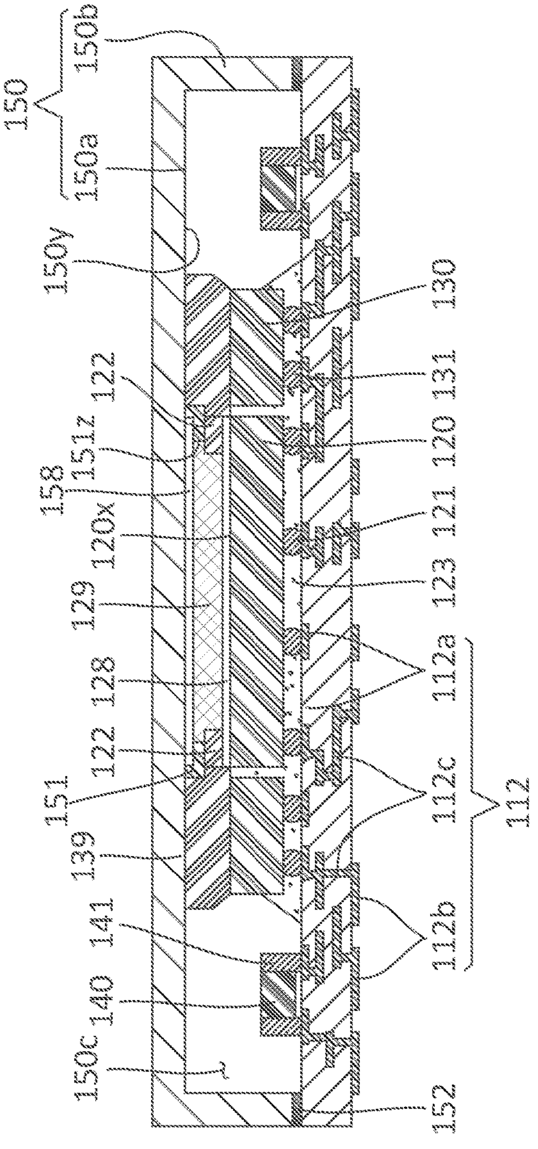
FIG.2E-B

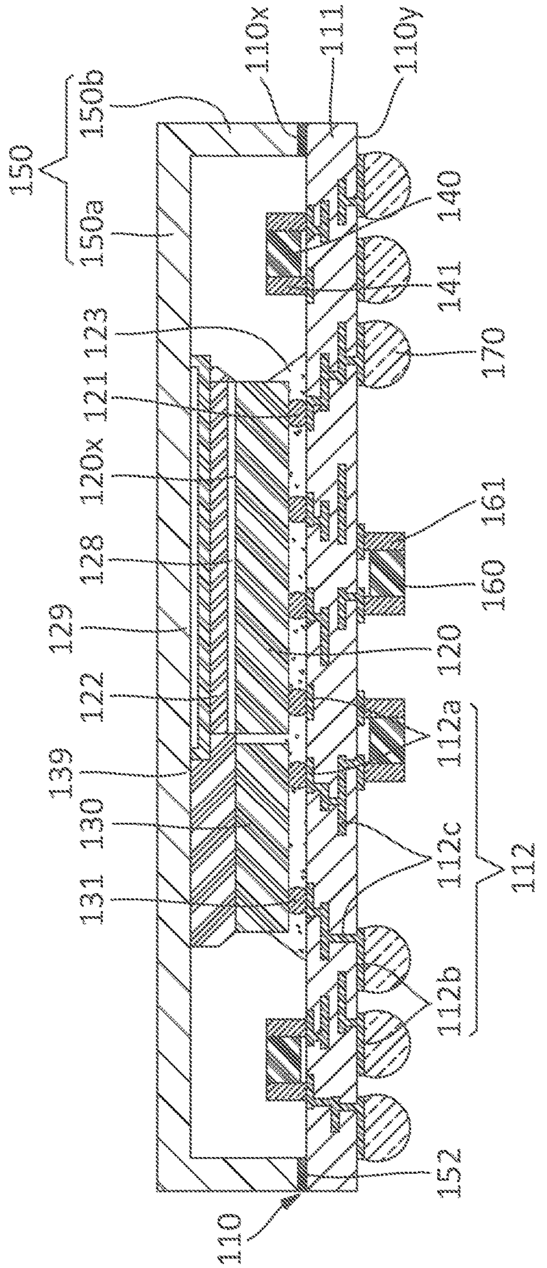
FIG.2F-A
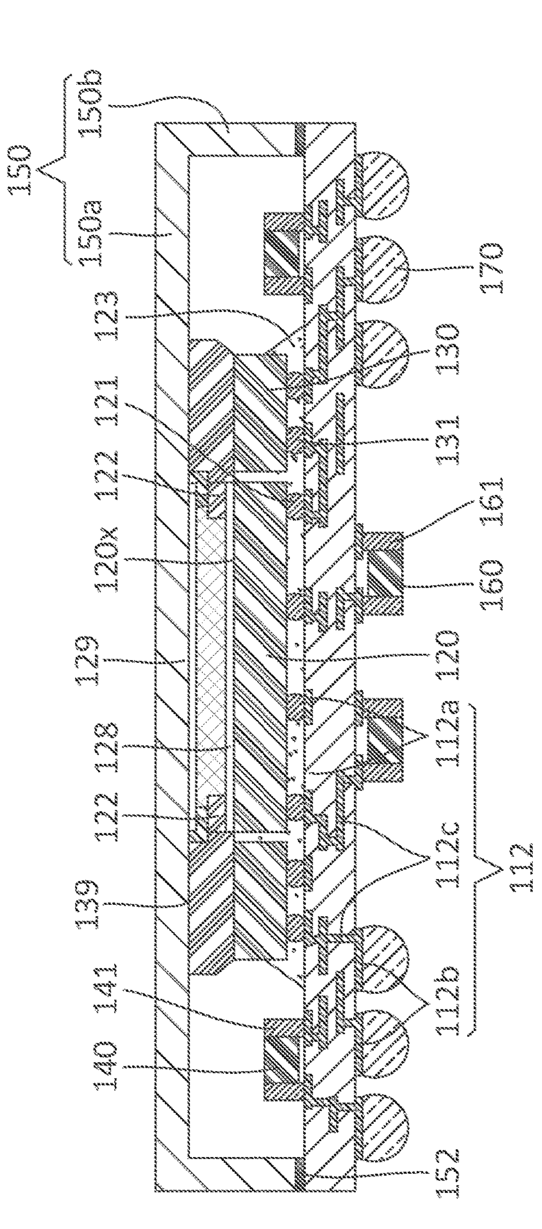
FIG.2F-B

ELECTRONIC DEVICES AND METHODS OF MANUFACTURING ELECTRONIC DEVICES

CROSS-REFERENCE TO RELATED APPLICATIONS

Not Applicable

TECHNICAL FIELD

The present disclosure relates, in general, to electronic devices, and more particularly, to electronic devices and methods for manufacturing electronic devices.

BACKGROUND

Prior electronic packages and methods for forming electronic packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B-A, 2B-B, 2C-A, 2C-B, 2D-A, 2D-B, 2E-A, 2E-B, 2F-A, and 2F-B show cross-sectional views of an example method for manufacturing an example electronic device.

Figure 1A:
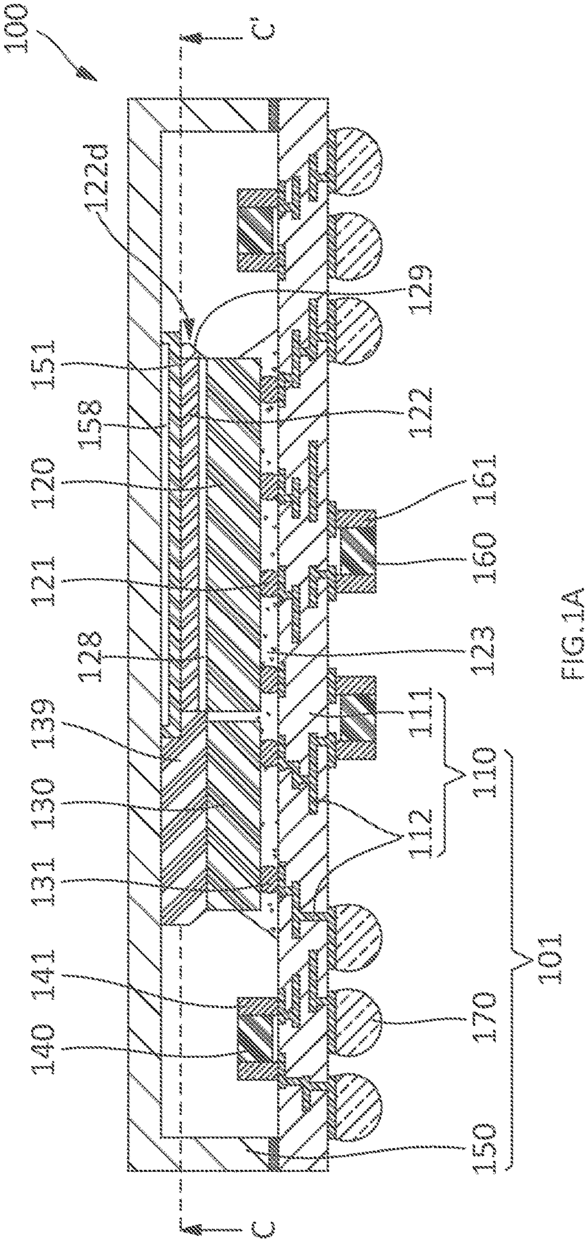
FIGS. 1A, 1B, and 1C show cross-sectional views of an example electronic device.

The following discussion provides various examples of electronic devices and methods of manufacturing electronic devices. Such examples are non-limiting, and the scope of the appended claims should not be limited to the particular examples disclosed. In the following discussion, the terms “example” and “e.g.” are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term “or” means any one or more of the items in the list joined by “or”. As an example, “x or y” means any element of the three-element set {(x), (y), (x, y)}. As another example, “x, y, or z” means any element of the seven-element set {(x), (y), (z), (x, y), (x, z), (y, z), (x, y, z)}.

The terms “comprises,” “comprising,” “includes,” and/or “including,” are “open ended” terms and specify the presence of stated features, but do not preclude the presence or addition of one or more other features.

The terms “first,” “second,” etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term “coupled” may be used to describe two elements directly contacting each other or describe two elements indirectly coupled by one or more other elements. For example, if element A is coupled to element B, then element A can be directly contacting element B or indirectly coupled to element B by an intervening element C. Similarly, the terms “over” or “on” may be used to describe two elements directly contacting each other or describe two elements indirectly coupled by one or more other elements.

DESCRIPTION

In the electronics industry, power density requirements for transistor devices and integrated circuit (IC) devices are increasing while node sizes are decreasing. In view of these trends, the heat dissipation characteristics of electronic packages has become more important. Package thermal resistance is a measure of a electronic package’s heat dissipation capability from an electronic die (i.e., junction) to a specified reference point, such as case, board, or ambient. A common thermal relationship for electronic packages includes junction-to-air thermal resistance (theta-JA) and junction-to-case thermal resistance (theta JC). Theta JA is a measure of the ability of an electronic component to dissipate heat from the surface of an electronic die to the ambient through all paths. Theta JC is part of theta JA and is a measure of the ability of the electronic component to dissipate heat from the surface of the electronic die to the top or bottom of the package the electronic die is contained within.

The present description includes, among other features, structures and associated methods that relate to electronic devices including, for example, semiconductor devices configured in multi-chip modules having, among other things, improved theta JC performance. In some examples, multiple semiconductor devices are placed on a substrate with reduced spacing and with different heat dissipation requirements. Semiconductor devices requiring higher thermal performance can be configured with a higher thermal conductivity interface material and semiconductor devices requiring a lower thermal performance can be configured with a lower thermal conductivity interface material. In some examples, a dam structure is provided to separate or reduce intermixing of the different interface materials and to reduce any overflow of the higher thermal conductivity interface material during the curing process. The dam structure can include a vent positioned to control the overflow interface material, for example, away from other electronic components. Among other things, the structures and methods facilitate higher density integration, improve head dissipation, and improve reliability.

In an example, an electronic device includes a substrate having a substrate top side, a substrate bottom side opposite to the substrate top side. A first electronic component is connected to the substrate top side and having a first electronic component top side distal to the substrate top side. A second electronic is connected to the substrate top side, laterally spaced apart from the first electronic component, and having a second electronic component top side distal to the substrate top side. A lid is connected to the substrate top side, covering the first electronic component and the second electronic component. The lid includes a lid ceiling; and a lid wall extending from the lid ceiling and defining a lid periphery. A dam structure is connected to the first electronic device top side and the lid ceiling within the lid periphery and having a vent. A first interface material is over the first electronic component top side and contained within the dam structure. A second interface material is over the second electronic component top side and connected to the lid ceiling, where the dam structure separates the first interface material from the second interface material. The first interface material has a higher thermal conductivity than the second interface material. In some examples, the first interface material is a metal interface material and the second interface material is a polymer thermal interface material.

In an example, an electronic device includes a substrate having a substrate top side, a substrate bottom side opposite to the substrate top side and comprising a substrate dielectric structure and a substrate conductive structure. A first electronic component is connected to the substrate conductive structure at the substrate top side and having a first electronic component top side distal to the substrate top side. A second electronic component is connected to the substrate conductive structure at the substrate top side, laterally spaced apart from the first electronic component, and having a second electronic component top side distal to the substrate top side. A component dam is connected to the first electronic component top side and defining a component dam cavity. An enclosure connected to the substrate and over the first electronic component and the second electronic component and includes an enclosure ceiling; an enclosure wall extending from the enclosure ceiling and defining an enclosure periphery; and an enclosure dam within the enclosure periphery and connected to the enclosure ceiling and the component dam and defining an enclosure dam cavity. A first interface material is over the first electronic component top side and within the component dam cavity and the enclosure dam cavity. A second interface material is over the second electronic component top side, where portions of the component dam and the enclosure dam are interposed between the first interface material and the second interface material.

In an example, a method of manufacturing an electronic device includes providing a substrate having a substrate top side, a substrate bottom side opposite to the substrate top side and comprising a substrate dielectric structure and a substrate conductive structure. The method includes connecting a first electronic component to the substrate conductive structure at the substrate top side, the first electronic component having a first electronic component first side distal to the substrate top side and a component dam coupled to the first electronic component first side that defines a component dam cavity. The method includes connecting a second electronic component to the substrate conductive structure at the substrate top side, laterally spaced apart from the first electronic component, and having a second electronic component first side distal to the substrate top side. The method includes providing a first interface material over the first electronic component top side and within the component dam cavity. The method includes providing a second interface material over the second electronic component top side. The method includes providing an enclosure including an enclosure ceiling; an enclosure wall extending from the enclosure ceiling and defining an enclosure periphery; and an enclosure dam within the enclosure periphery and coupled to the enclosure ceiling and the component dam and defining an enclosure dam cavity. The method includes connecting the enclosure to the substrate over the first electronic component and the second electronic component, where the component dam and the enclosure dam separate the first interface material from the second interface material.

Other examples are included in the present disclosure. Such examples may be found in the figures, in the claims, and/or in the description of the present disclosure.

Figure 1B:
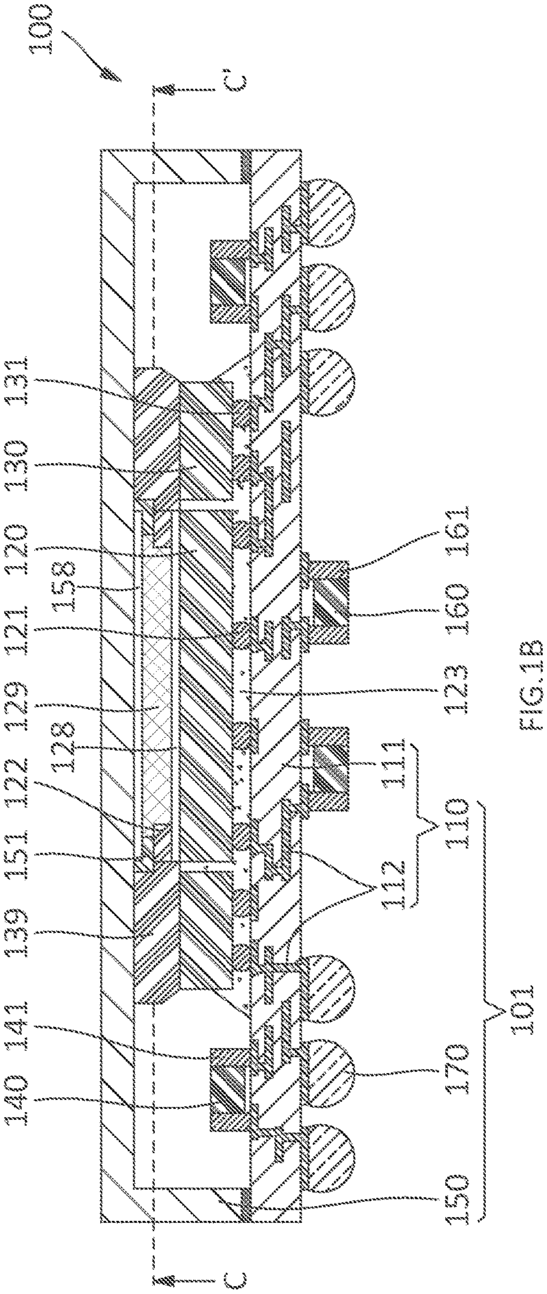
Figure 1C:
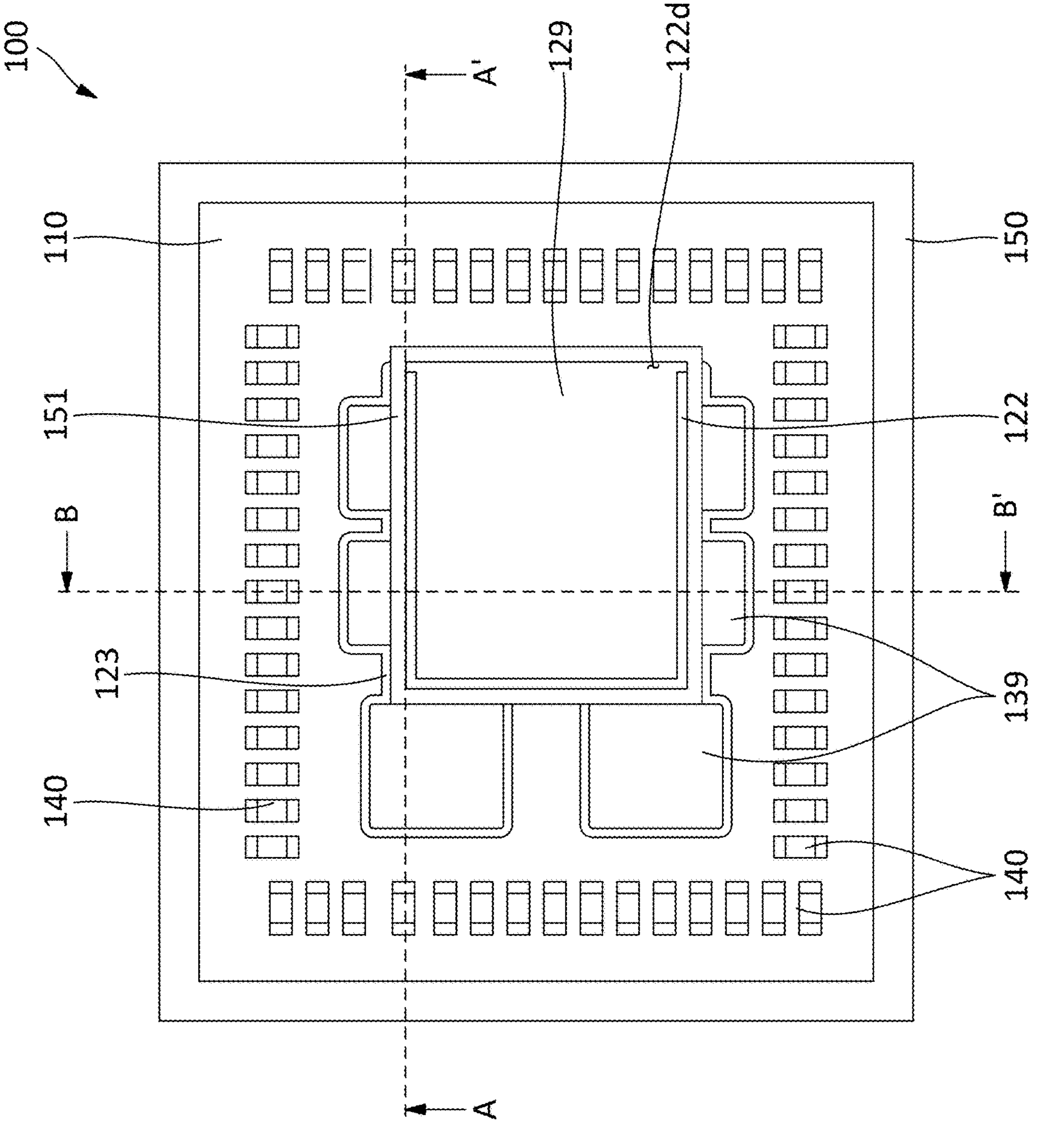

FIGS. 1A, 1B and 1C show cross-sectional views and a top view of an example electronic device 100. FIG. 1A is a cross-sectional view taken along line A-A' in FIG. 1C, FIG. 1B is a cross-sectional view taken along line B-B' in FIG. 1C, and FIG. 1C is a top view taken along line C-C' in FIGS. 1A and 1B.

In the example shown in FIGS. 1A to 1C, electronic device 100 can comprise substrate 110, electronic components 120, 130, 140, and 160, lid 150, and external terminals 170.

Substrate 110 can comprise dielectric structure 111 and conductive structure 112. Electronic components 120, 130, 140, and 160 can comprise component terminals 121, 131, 141 and 161. Electronic component 120 can comprise component dam 122, and lid 150 can comprise lid dam 151. Component dam 122 can comprise dam vent 122*d*. Electronic components 120 and 130 can comprise interface materials 129 and 139, respectively. Component dam 122, lid dam 151, and combinations thereof are examples of dam structures.

Substrate 110, lid 150, and external terminals 170 can comprise or be referred to as electronic package 101 or package 101. Electronic package 101 can protect electronic component 120 from external elements and/or environmental exposure. Electronic package 101 can provide electrical coupling between external components or other electronic packages and electronic components 120, 130, 140, and 160.

Figure 2A:
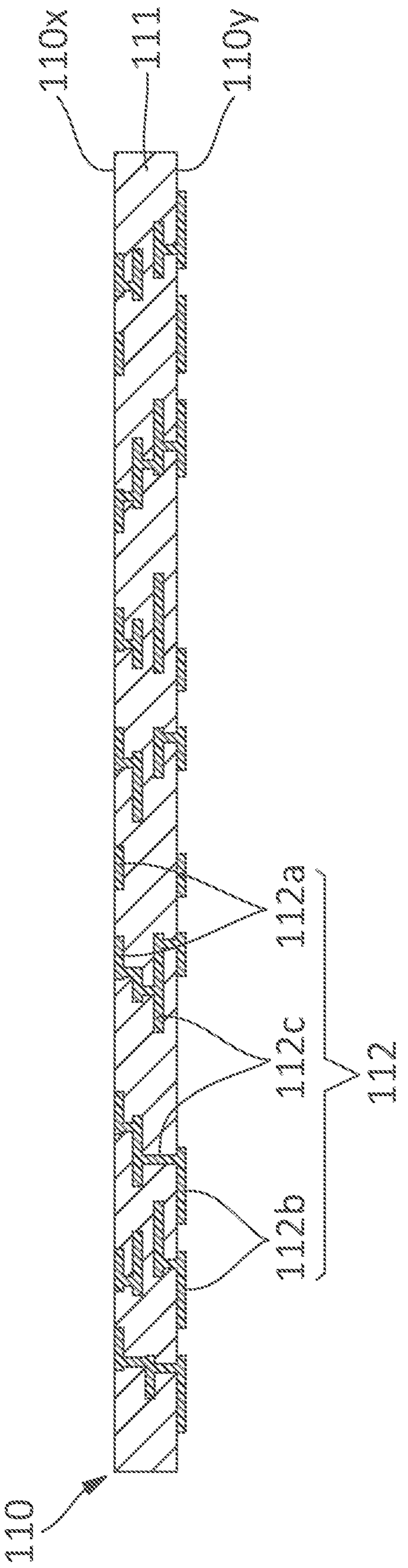
Figure 3B:
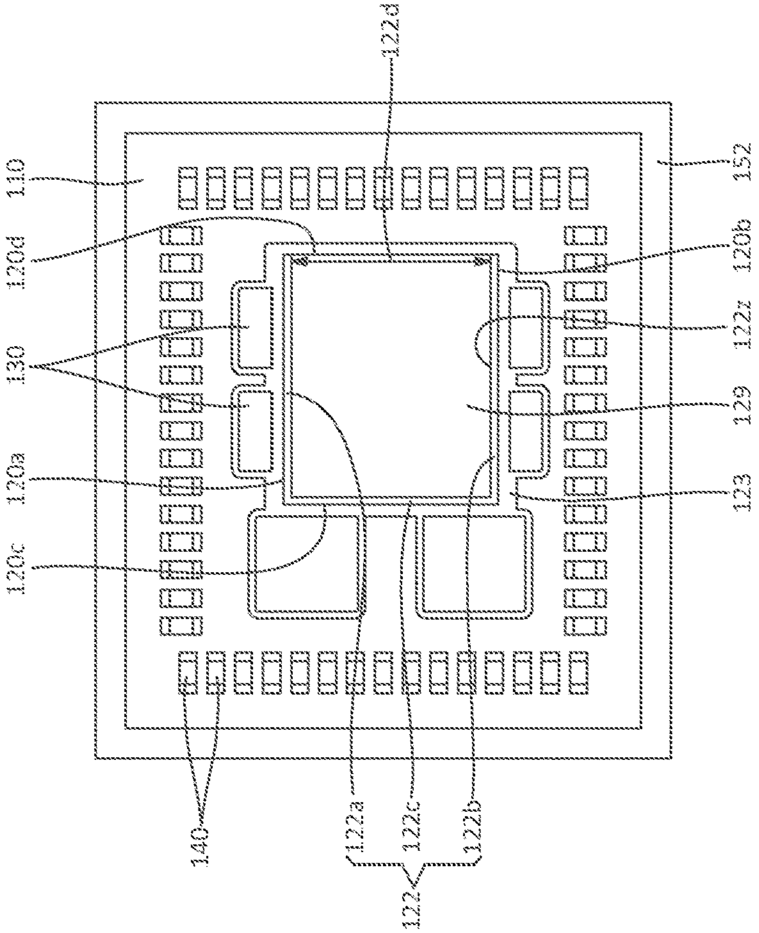
FIGS. 3A, 3B, and 3C show plane views of an example method for manufacturing an example electronic device shown in FIG. 2B-A to 2D-B.
Figure 3A:
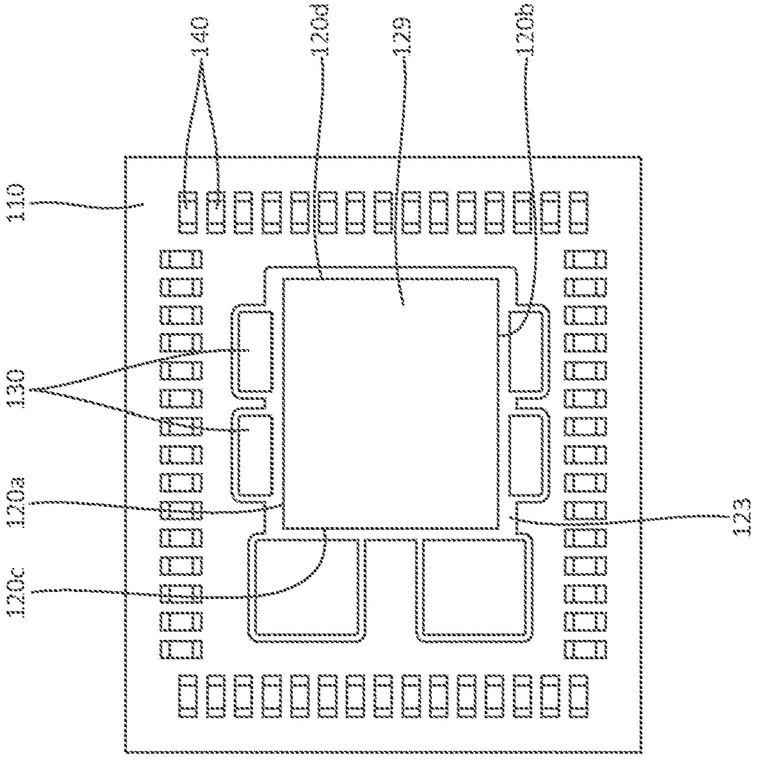
Figure 3C:
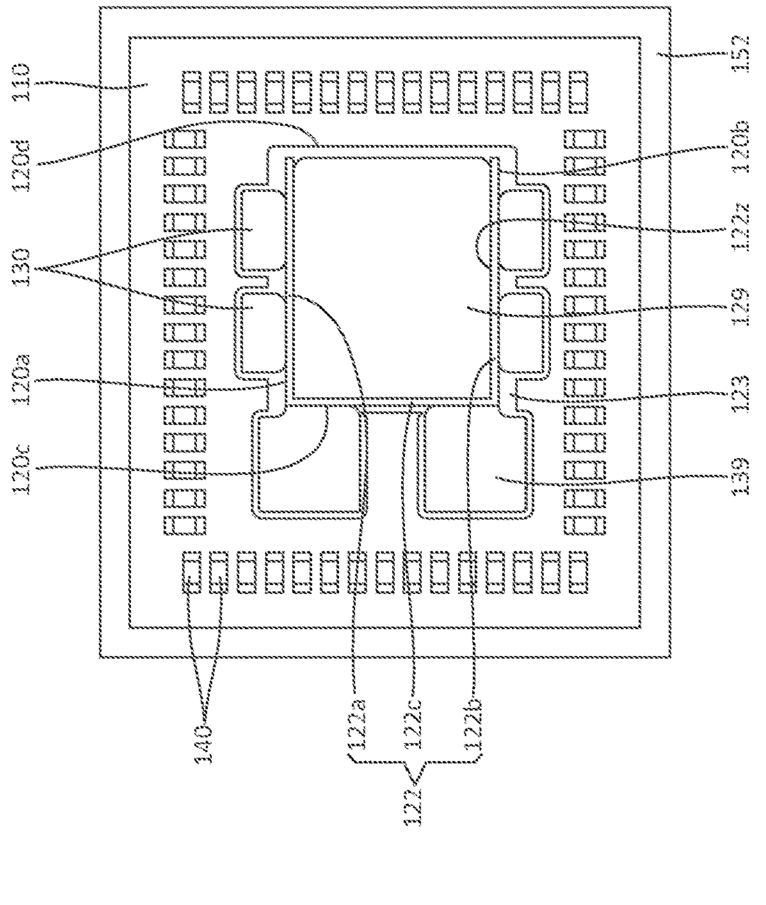

FIGS. 2A, 2B-A, 2B-B, 2C-A, 2C-B, 2D-A, 2D-B, 2E-A, 2E-B, 2F-A, and 2F-B show cross-sectional views of an example method for manufacturing an example electronic device 100. FIGS. 3A, 3B, and 3C show top views of an example electronic device 100. FIG. 2A and FIGS. 2B-A to 2F-A are cross-sectional views illustrating the method along a cross section taken along line A-A' of electronic device 100 shown in FIG. 1C. FIGS. 2B-B to 2F-B are cross-sectional views illustrating the method along a cross section taken along line B-B' of electronic semiconductor device 100 shown in FIG. 1C.

FIG. 2A shows a cross-sectional view of electronic device 100 at an early stage of manufacture. Substrate 110 can comprise a dielectric structure 111 and a conductive structure 112.

In some examples, dielectric structure 111 can comprise or be referred to as one or more dielectric layers. For instance, the one or more dielectric layers can comprise one or more dielectric layers such as, a core layer, a polymer layer, pre-preg layers, or solder mask layers stacked on each other. One or more layers or elements of conductive structure 112 can be interposed or embedded between the one or more layers of dielectric structure 111. The upper and lower sides of dielectric structure 111 can be upper side 110*x* and lower side 110*y* of substrate 110, respectively. In some examples, dielectric structure 111 can comprise an epoxy resin, a phenolic resin, a glass epoxy, a polyimide, a polyester, an epoxy molding compound, or a ceramic. In some examples, the thickness of dielectric structure 111 can range from approximately 0.02 millimeters (mm) to approximately 0.05 mm.

Conductive structure 112 can comprise one or more conductive layers and defines conductive paths with elements such as traces, pads, vias, and wiring patterns. Conductive structure 112 can comprise inward terminal 112*a* provided on upper side 110*x* of dielectric structure 111, outward terminal 112*b* provided on lower side 110*y* of dielectric structure 111, and conductive path 112*c* extending through dielectric structure 111.

Inward terminal 112*a* and outward terminal 112*b* can be respectively provided on upper side 110*x* and lower side 110*y* of dielectric structure 111 in a matrix form having rows and/or columns, respectively. In some examples, inward terminal 112*a* or outward terminal 112*b* can comprise or be referred to as a conductor, a conductive material, a substrate land, a conductive land, a substrate pad, a wiring pad, a connection pad, a micro pad, or under-bump-metallurgy (UBM). The thicknesses of inward terminal 112*a* or outward terminal 112*b* can range from approximately 10 μm to approximately 25 μm.

Conductive path 112*c* can be formed in dielectric structure 111 to couple inward terminal 112*a* with outward terminal 112*b*. Conductive path 112*c* can be formed of one or more conductive layers. In some examples, conductive path 112*c* can comprise or be referred to as one or more conductors, conductive material, vias, circuit patterns, traces, or wiring patterns. In some examples, inward terminal 112*a*, outward terminal 112*b*, and conductive path 112*c* can comprise copper, iron, nickel, gold, silver, palladium, or tin.

In some examples, substrate 110 can comprise or be referred to as a printed circuit board, a multilayer substrate, a laminate substrate, or a molded lead frame. In some examples, substrate 110 can comprise or be referred to as a redistribution layer (RDL) substrate, a buildup substrate, or a coreless substrate.

In some examples, substrate 110 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can referred to as a printed circuit board (PCB) or a laminate substrate. Such pre-formed substrate can be formed through a semi-additive or modified-semi-additive process. Other substrates in this disclosure can also comprise a pre-formed substrate.

In some examples, substrate 110 can be an RDL substrate. RDL substrates can comprise one or more conductive redistribution layers and one or more dielectric layers and (a) can be formed layer by layer over an electronic device to where the RDL substrate is to be coupled, or (b) can be formed layer by layer over a carrier and can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, and can include a photolithographic mask through where light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride (Si3N4), silicon oxide (SiO2), and/or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate. Other substrates in this disclosure can also comprise an RDL substrate.

FIGS. 2B-A and 2B-B show cross-sectional views and FIG. 3A shows a top view of electronic device 100 at a later stage of manufacture. In the example shown in FIGS. 2B-A, 2B-B and 3A, electronic components 120, 130, or 140 can be provided coupled with respective inward terminals 112*a* of substrate 110.

In some examples, pick-and-place equipment can pick up electronic components 120, 130, and 140, respectively, and place them on inward terminals 112*a* of substrate 110. In some examples, electronic components 120, 130, and 140 can be secured to inward terminals 112*a* of substrate 110 through mass reflow, thermal compression, or laser assisted bonding processes, respectively.

In some examples, electronic component 120 can comprise or be referred to as a semiconductor die, a semiconductor chip, a semiconductor package, or a land side capacitor (LSC). In some examples, electronic component 130 can comprise or can be referred to as an active or passive component. Component terminals 121 can be provided on the lower side of electronic component 120 spaced apart from each other in row and/or column directions. In some examples, component terminal 121 can comprise or be referred to as a pad, a bump, a pillar, a conductive post, or a solder ball. Component terminals 121 can comprise an electrically conductive material such as a metallic material, aluminum, copper, an aluminum alloy, a copper alloy, or solder.

Component terminal 121 can comprise a low-melting-point material and can be connected to inward terminal 112*a* of substrate 110. For example, the low melting point material of component terminal 121 can comprise any one selected from Sn, Ag, Pb, Cu, Sn—Pb, Sn37-Pb, Sn95-Pb, Sn—Pb—Ag, Sn—Cu, Sn—Ag, Sn—Au, Sn—Bi, Sn—Ag—Cu, and equivalents. Component terminal 121 of electronic component 120 and inward terminal 112*a* of substrate 110 can be electrically connected to each other by the low-melting-point material of component terminal 121. The total thickness of electronic component 120 can range from approximately 100 μm to approximately 800 μm.

Electronic component 120 can have four sides. For example, electronic component 120 can have four lateral sides 120*a*, 120*b*, 120*c*, and 120*d*. Four lateral sides 120*a*, 120*b*, 120*c*, and 120*d* are perpendicular to top side of electronic component 120. Here, lateral side 120*a* is opposite to lateral side 120*b*, lateral side 120*c* is opposite to lateral side 120*d*, and lateral sides 120*c* and 120*d* can connect ends of lateral sides 120*a* and 120*b*.

In some examples, electronic component 120 can be provided with component metallization 128 to uniformly cover upper side 120*x*. Component metallization 128 can be in contact with and attached to upper side 120*x* of electronic component 120. In some examples, component metallization 128 can comprise or be referred to as a backside metallization, a plating layer, or a conductive film. For example, component metallization 128 can comprise gold, gold alloys, or similar solderable materials. In some examples, component metallization 128 can be formed by electroless plating, electrolytic plating, sputtering, or physical vapor deposition (PVD). In some examples, the thickness of component metallization 128 can range from approximately 0.3 μm to approximately 30 μm.

Component terminals 131 can be provided on the lower side of electronic component 130. Electronic component 130 can comprise corresponding elements, features, materials, or manufacturing methods similar to those of electronic component 120 previously described. For example, component terminal 131 of electronic component 130 can be similar to component terminal 121 of electronic component 120. In the present example, electronic component 130 need not comprise component metallization 128. Electronic component 130 can be a low-power device compared to electronic component 120. In some examples, electronic component 130 can comprise or be referred to as a semiconductor die, a semiconductor chip, or a semiconductor package. In some examples, electronic component 130 can comprise or be referred to as an active or a passive component.

In some examples, electronic component 130 can comprise one or more electronic components. In some example, fewer or more than six electronic components 130 can be provided on substrate 110. Electronic component 130 can be disposed on upper side 110*x* of substrate 110 spaced apart from at least one lateral side of electronic component 120. For example, electronic components 130 can be respectively disposed on upper side 110*x* of substrate 110 spaced apart from three sides of electronic component 120 having four sides. Electronic components 130 can be seated on upper side 110*x* of substrate 110 such that respective lateral sides of electronic component 130 face lateral sides 120*a*, 120*b*, or 120*c* of electronic component 120. In some examples, a distance between the lateral side of electronic component 130 and the lateral side of electronic component 120 can range from approximately 50 μm to approximately 200 μm. In some examples, the total thickness of electronic component 130 can be thinner or similar to the thickness of electronic component 120. For example, the total thickness of electronic component 130 can range from approximately 100 μm to approximately 800 μm.

In some examples, underfill 123 can be inserted between electronic component 120 and substrate 110 or between electronic component 130 and substrate 110. Underfill 123 can comprise or be referred to as a dielectric layer or a non-conductive paste, and can be a resin without an inorganic filler. In some examples, underfill 123 can be cured after electronic component 120 and electronic component 130 are coupled to substrate 110 and can be dispensed between electronic component 120 and substrate 110. Underfill 123 can also be interposed between electronic component 120 and electronic component 130. Underfill 123 can prevent electronic component 120 and electronic component 130 from being electrically decoupled from substrate 110 from physical impact or chemical impact.

Electronic component 140 can be provided with a plurality of component terminals 141 on its lower side. Electronic component 140 can comprise corresponding elements, features, materials, or manufacturing methods similar to those of electronic component 120 previously described. For example, component terminal 141 of electronic component 140 can be similar to component terminal 121 of electronic component 120. In the present example, electronic component 140 need not comprise component metallization 128, and can be a passive device.

Electronic component 140 can comprise one or more electronic components disposed spaced apart from the lateral sides of electronic component 120 and the lateral sides of electronic component 130. Electronic components 140 can be arranged in a matrix form having rows and/or columns to be spaced apart from the lateral sides of electronic components 120 and 130.

Electronic component 130 can be positioned between electronic components 140 and electronic component 120. The lateral sides of electronic components 140 spaced apart from lateral side 120*d* of electronic component 120 can face lateral side 120*d* of electronic component 120. The distance between electronic component 140 and electronic component 120 can be greater than the distance between electronic component 130 and electronic component 120. In some examples, the distances between respective electronic components 120, 130, or 140 can range from approximately 50 μm to approximately 200 μm.

FIGS. 2C-A and 2C-B show cross-sectional views and FIG. 3B shows a top view of electronic device 100 at a later stage of manufacture. In the example shown in FIGS. 2C-A, 2C-B and 3B, component dam 122 can be provided on upper side 120*x* of electronic component 120. In some examples, component dam 122 can have a predetermined height upward from the edge region of upper side 120*x* of electronic component 120. In some examples, component dam 122 can be provided in contact with component metallization 128 of electronic component 120.

For example, component dam 122 can comprise component dam walls 122*a*, 122*b* and 122*c* and extend upwardly adjacent to respective edge regions of upper side 120*x* of rectangular electronic component 120. The edge regions of upper side 120*x* of electronic component 120 can be regions adjacent to upper ends of lateral sides 120*a*, 120*b*, 120*c*, or 120*d*. Component dam walls 122*a*, 122*b*, 122*c* can be provided in regions adjacent to the upper ends of lateral sides 120*a*, 120*b* and 120*c* of electronic component 120, respectively. The outer sides of component dam walls 122*a*, 122*b*, 122*c* can be coplanar with lateral sides 120*a*, 120*b*, 120*c* of electronic component 120, respectively. Component dam walls 122*a*, 122*b*, 122*c* can have an inner side of component dam wall 122*a* and an inner side of component dam wall 122*b* facing each other. Component dam wall 122*c* can connect ends of component dam wall 122*a* and component dam wall 122*b*. Component dam 122 can leave one side open, such as in a "C" shape. Component dam 122 can define cavity 122*z* between dam walls 122*a*, 122*b*, 122*c*. In some examples, component dam 122 can comprise or be referred to as a polymer or dielectric. In some examples, component dam 122 can be applied through dispensing or printing, or can be attached in the form of a film. In some examples, the thickness of component dam 122 can range from approximately 50 μm to approximately 200 μm. In some examples, the width of each of component dam walls 122*a*, 122*b* and 122*c* can range from approximately 50 μm to approximately 500 μm.

In component dam 122, dam vent 122*d* can be defined adjacent to the upper end of lateral side 120*d* of electronic component 120. In upper side 120*x* of electronic component 120, the region adjacent to lateral side 120*d* can be exposed by dam vent 122*d*. In some examples, dam vent 122*d* can be defined as a gap between component dam wall 122*a* and component dam wall 122*b* facing each other.

Lid adhesive 152 can be provided adjacent to edges of upper side 110*x* of substrate 110. Electronic components 120, 130, and 140 can be positioned within a perimeter of lid adhesive 152. Lid adhesive 152 can be a square ring and partially covers upper side 110*x* of substrate 110. In some examples, lid adhesive 152 can have a thickness ranging from approximately 50 μm to approximately 250 μm. In some examples, lid adhesive 152 can be applied to upper side 110*x* of substrate 110 by dispensing In some examples, lid adhesive 152 can comprise or be referred to as a polymer or a dielectric. For example, component dam 122 and lid adhesive 152 can comprise similar or same materials. In some examples, component dam 122 and lid adhesive 152 can be respectively applied concurrently to electronic component 120 and substrate 110 by a dispensing tool. In some examples, lid adhesive 152 can comprise a conductive material such as solder or solder paste.

FIGS. 2D-A and 2D-B show cross-sectional views and FIG. 3C shows a top view of electronic device 100 at a later stage of manufacture. In the example shown in FIGS. 2D-A, 2D-B and 3C, interface material 129 can be provided on upper side 120*x* of electronic component 120, and interface material 139 can be provided on upper side 130*x* of electronic component 130. More particularly, in accordance with the present description, the type of interface material used for interface material 129 or interface material 139 is determined by the heat dissipation requirements of the electronic components (for example, electronic component 120 and electronic component 130) within the electronic device 100. For example, for an electronic device where the junction temperature of the electronic device is not expected to exceed 40 degrees Celsius, an interface material having a thermal conductivity less than about 5 W/mK can be selected. Examples of such thermal interface materials include polymer type thermal interface materials, such as silicone, epoxy, or urethane with highly thermal conductive fillers, such as graphite, boron nitride, silver, aluminum, or aluminum oxide. Such polymer interface materials can be an adhesive, gel, sheet, or grease formulations. For an electronic device where the junction temperature of the electronic device is expected to exceed about 90 degrees Celsius or more, an interface material having a thermal conductivity greater than about 15 W/Mk can be selected. Examples of such thermal interface materials include metal alloy materials, such as gallium, gallium alloys (e.g., alloys with indium, tin, and zinc), silver alloys, tin-silver, indium, and indium alloys. Such metal interface materials can be in solid metal or room temperature liquid metal formulations.

In some examples, interface material 129 can comprise or be referred to as a thermal interface material (TIM) or a metallic TIM. In some examples, interface material 129 can comprise a metal material. For example, interface material 129 can comprise heat conductive material, such as a metallic material like solder or solder paste. Interface material 129 can be made of a heat conductive material, and thus heat generated from electronic component 120 having high power can be more easily transferred. In some examples, interface material 129 has a thermal conductivity greater than about 20 W/mK. In some examples, interface material 129 has a thermal conductivity greater than about about 50 W/mK. In some examples, interface material 139 can comprise or be referred to as a thermal interface material (TIM) or a polymer TIM. In some examples, interface material 139 has a thermal conductivity less than about 10 W/mK. In some examples, interface material 139 has a thermal conductivity less than about 5 W/mK. In some examples, interface material 129 is an indium alloy thermal interface material and interface material 139 is a polymer interface material. In present example where electronic component 120 is a power device, such as a semiconductor power transistor, diode, or thyristor, and electronic component 130 is a lower power device, such as a memory device, interface material 129 has a higher thermal conductivity than interface material 139.

In some examples, when interface material 129 is a metal or metal alloy thermal interface material, interface material 129 can be in contact with component metallization 128 of electronic component 120 to reduce contact resistance between electronic component 120 and interface material 129 to improve heat dissipation. For example, interface material 129 can be provided on component metallization 128 to fill cavity 122*z* of component dam 122. Interface material 129 can be in contact with the inner side of each of component dam walls 122*a*, 122*b*, 122*c* of component dam 122. In some examples, interface material 129 can be applied to the upper side of component metallization 128 by dispensing or printing. In some examples, the thickness of interface material 129 can be provided to be greater than the thickness of each of component dam walls 122*a*, 122*b*, and 122*c*. For example, the thickness of interface material 129 can range from approximately 30 μm to approximately 300 μm.

In some examples, interface material 139 can be provided on each of upper sides 130*x* of electronic components 130. For example, interface material 139 can contact upper sides

130$x$ of electronic components 130 and can contact the outer sides of component dam walls 122$a$, 122$b$, or 122$c$ of component dam 122. Component dam 122 can prevent interface material 129 and interface material 139 from mixing before or after curing. In some examples, interface material 139 can be applied to upper sides 130$x$ of electronic components 130 by multi-dispensing or printing. In some examples, the thickness of interface material 139 can be similar to the thickness of interface material 129.

Figure 4:
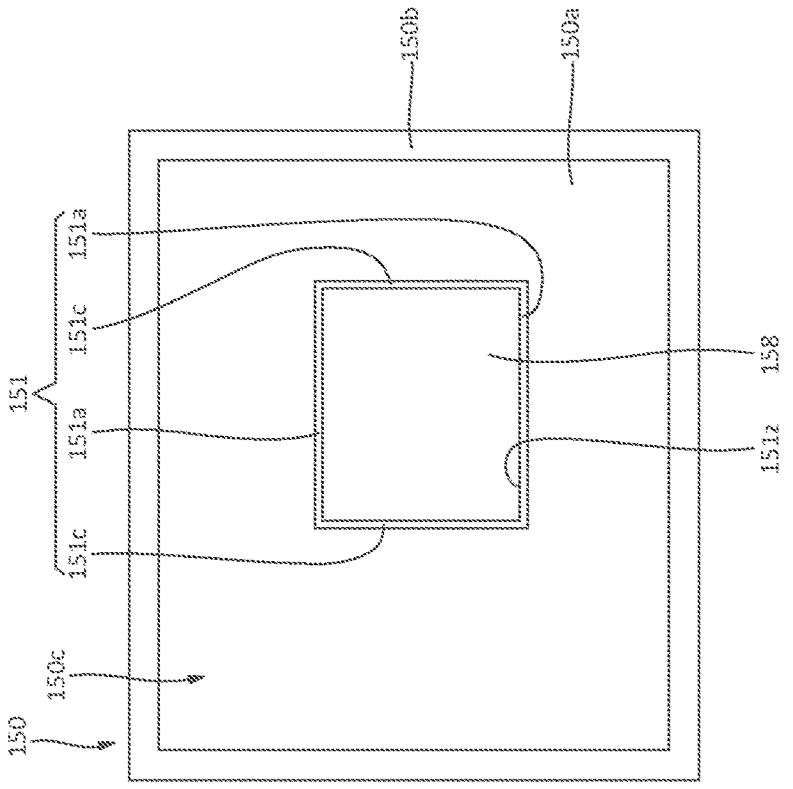
FIG. 4 shows a bottom view of an example enclosure.

FIGS. 2E-A and 2E-B show cross-sectional views of electronic device 100 at a later stage of manufacture. In the example shown in FIGS. 2E-A and 2E-B, lid 150 can be attached to upper side 110$x$ of substrate 110 to cover of electronic components 120, 130, and 140. FIG. 4 shows a bottom view of lid 150 before lid 150 is attached to substrate 110. Lid 150 can comprise lid ceiling 150$a$ and lid wall 150$b$ extending downward from edges of lid ceiling 150$a$. Lid 150 can comprise, at a lower portion of lid 150, lid ceiling 150$a$ and enclosure 150$c$ where electronic components 120, 130, and 140 are surrounded by lid wall 150$b$. A lower side of lid wall 150$b$ can be attached to upper side 110$x$ of substrate 110 through lid adhesive 152. Lid 150 can have a structure where lid ceiling 150$a$ and lid wall 150$b$ surround electronic components 120, 130, and 140 by enclosure 150$c$. Lid 150 can be made of a metal having high thermal conductivity and radiation. In some examples, lid 150 can comprise aluminum, steel, or copper. In some examples, lid 150 can be referred to as or comprise a heat sink, a cap, a cover, an encapsulation unit, or a protection unit. In some examples lid 150 can protect upper side 110$x$ of substrate 110 and electronic components 120, 130, and 140 from external elements and/or external exposure. In some examples, lid 150 can dissipate heat generated by electronic components 120 and 130. The thickness of lid 150 can range from approximately 0.5 mm to 5 mm.

Lid 150 can be provided with lid dam 151 protruding downward from lower side 150$y$ of lid ceiling 150$a$. In some examples, lid metallization 158 can be provided on lower side 150$y$ of lid ceiling 150$a$ located inside lid dam 151. When interface material 129 is a metal or metal alloy thermal interface material, lid metallization 158 is provided to reduce contact resistance between interface material 129 and lid 150 to improve heat dissipation. Lid metallization 158 can comprise corresponding elements, features, materials or manufacturing methods similar to those of component metallization 128 previously described. In the present example, lid metallization 158 can have a larger area than component metallization 128. For example, the area or perimeter of lid metallization 158 can be larger than that of upper side 120$x$ of electronic component 120.

In some examples, lid dam 151 can protrude in a rectangular ring shape from lower side 150$y$ of lid ceiling 150$a$. Lid dam 151 can contact the upper side of component dam 122 of electronic component 120 when lid 150 is attached to substrate 110. In some examples, lid dam 151 can comprise corresponding elements, features, materials, or methods of manufacture similar to those of component dam 122 previously described. Lid dam 151 can comprise lid dam walls 151$a$, 151$b$, 151$c$, and 151$d$. In the present example, lid dam 151 does not comprise a lid vent corresponding to dam vent 122$a$. In the present example, lid dam 151 can be applied or attached to lower side 150$y$ of lid ceiling 150$a$ and then hardened through heat treatment. Lid dam 151 can be applied through dispensing or printing, or can be attached in the form of a film and can be cured through heat treatment.

Lid dam 151 can be in a rectangular ring shape. Lid dam 151 can comprise four lid dam walls 151$a$, 151$b$, 151$c$, and 151$d$ and extend downward from lower side 150$y$ of lid ceiling 150$a$. Lid dam 151 can have cavity 151$z$ provided therein by lid dam walls 151$a$, 151$b$, 151$c$, and 151$d$. Each of lid dam walls 151$a$, 151$b$, 151$c$, and 151$d$ can be aligned to correspond to component dam walls 122$a$, 122$b$, 122$c$ and dam vent 122$d$ of component dam 122. In some examples, lid dam walls 151$a$, 151$b$, and 151$c$ can contact and engage the upper sides of component dam walls 122$a$, 122$b$, and 122$c$, and lid dam wall 151$d$ can be located on top of dam vent 122$d$. In some examples, lid dam 151 can have a larger planar dimension, area, or perimeter compared to component dam 122. For example, a region adjacent to the inner side of the lower side of each of lid dam walls 151$a$, 151$b$, and 151$c$ can be in contact with and coupled to a region adjacent to the outer side of the upper side of each of component dam walls 122$a$, 122$b$, and 122$c$.

In some examples, pick-and-place equipment can pick up lid 150 and align and seat the lower side of lid wall 150$b$ on lid adhesive 152 provided on substrate 110. Lid dam walls 151$a$, 151$b$, and 151$c$ of lid dam 151 can be aligned and seated on top of component dam walls 122$a$, 122$b$, and 122$c$ of component dam 122. Since the planar size of lid dam 151 is larger than the planar size of component dam 122, interface material 129 provided in cavity 122$z$ of component dam 122 can be inserted into cavity 151$z$ of lid dam 151. Subsequently, as the lid adhesive 152 is cured through a curing process using heat, light, or ultraviolet light, lid 150 can be secured to substrate 110. In some examples, through the curing process, component dam 122 can be adhered and secured to lid dam 151 while being cured. Interface material 139 comprising a dielectric can be adhered and secured between lid 150 and electronic component 130 by a curing process.

Subsequently, interface material 129 can be reflowed or cured through a metal curing process such as mass reflow, thermal compression, or laser assisted bonding to bond and fix lid 150 and electronic component 120. Interface material 129 can fill cavities 122$z$ and 151$z$ between component dam 122 and lid dam 151 in a viscous liquid state while being reflowed during the metal curing process. While being reflowed, interface material 129 can partially drain overflow through dam vent 122$d$ of component dam 122. Dam vent 122$d$ of component dam 122 can prevent interface material 129 from being broken or voided due to space limitations of cavities 122$z$ and 151$z$ when interface material 129 is reflowed and cured.

Since interface material 129 is contained within component dam 122 and lid dam 151 the overflow of interface material 129 can be controlled. With dam vent 122$d$ placed away from electronic component 130, the overflow of interface material 129 proximate to electronic component 130 is restricted thereby reducing the potential for reliability issues. That is, dam vent 122$d$ is placed in location where the impact of any overflow of interface material 129 on other components is minimized. In addition, interface material 129 is adhered to wettable component metallization 128 and lid metallization 158 while being reflowed thereby reducing contact resistance and improving heat dissipation. Further, component dam 122 and lid dam 151 reduce or prevent contact or intermixing between interface material 129 and interface material 139, thereby preventing voids or other unwanted defects from being generated. Such voids and defects reduce the thermal conductivity of the interface materials thereby degrading heat dissipation between the electronic components and the lid.

One advantage of the present description is that the structures and methods facilitate the use of interface materials having thermal conductivities selected in accordance with the power density and thermal requirements of the specific electronic components. For example, those electronic components having higher heat dissipation requirements can use higher thermal conductivity interface materials (e.g., greater than 10 W/mK), and those electronic components with lower heat dissipation requirements can use lower thermal conductivity materials (e.g., less than about 5 W/mK). With higher thermal conductivity materials, such as metal thermal interface materials, the structures and methods provide a dam structure to restrict flow and vent the overflow of the interface material during the curing process. In addition, component metallization and lid metallization are provided to improve solderability and reduce contact resistance with the metal thermal interface materials thereby improving heat dissipation. Moreover, when using lower thermal conductivity materials, such as polymer thermal interface materials, with lower power devices, dam structures are not required on or over such devices to contain the flow of the polymer thermal interface materials, and component and lid metallizations are not required. This reduces manufacturing costs and improves design flexibility.

FIGS. 2F-A and 2F-B show cross-sectional views of electronic device 100 at a later stage of manufacture. In the example shown in FIGS. 2F-A and 2F-B, electronic component 160 and external terminal 170 can be provided coupled to outward terminal 112*b* of substrate 110.

Electronic component 160 can comprise corresponding elements, features, materials, or manufacturing methods similar to those of any of electronic component 140, 130, 120 previously described.

In some examples, external terminal 170 can be coupled to electronic components 120, 130, 140, or 160 through conductive structure 112 of substrate 110. Electronic components 120, 130, 140, 160 can be coupled to each other or to external terminals 170 through substrate 110. In some examples, external terminal 170 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. For example, external terminal 170 can be formed through a reflow process after forming a conductive material including solder on the lower side of outward terminal 112*b* of substrate 110 through a ball drop method. External terminal 170 can comprise or be referred to as a conductive ball such as a solder ball, a conductive pillar such as a copper pillar, or a conductive post having a solder cap formed on the copper pillar. In some examples, the width or height of external terminal 170 can range from approximately 50 μm to 250 μm. In some examples, external terminal 170 can comprise or be referred to as an external input/output terminal of electronic device 100.

In some examples, a singulation process of separating substrate 110 into individual electronic devices 100 can be performed by sawing substrate 110. Electronic device 100 can comprise substrate 110, electronic components 120, 130, 140, and 160, lid 150, and external terminal 170.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. An electronic device, comprising:

a substrate comprising a substrate top side and a substrate bottom side opposite to the substrate top side;

a first electronic component coupled to the substrate top side and comprising a first electronic component top side distal to the substrate top side;

a second electronic component coupled to the substrate top side, laterally spaced apart from the first electronic component, and comprising a second electronic component top side distal to the substrate top side;

a lid coupled to the substrate top side, covering the first electronic component and the second electronic component, and comprising:

a lid ceiling; and a lid wall extending from the lid ceiling and defining a lid periphery;

a multi-part dam structure forming a sealed perimeter around the first electronic component except for a vent, the multi-part dam structure comprising:

a component dam comprising a first material and bonded to the first electronic component top side, the component dam comprising a component dam top side; and a lid dam comprising a second material and bonded to the lid ceiling, the lid dam comprising a lid dam bottom side, wherein the lid dam is vertically aligned with and vertically overlaps the component dam such that the component dam top side and the lid dam bottom side contact each other along a closed interface to form the sealed perimeter, and wherein the lid dam vertically separates the component dam from the lid, and wherein the component dam vertically separates the lid dam from the first electronic component;

a first interface material over the first electronic component top side and contained within the multi-part dam structure; and a second interface material over the second electronic component top side and coupled to the lid ceiling;

wherein:

the first interface material comprises a first thermal conductivity;

the second interface material comprises a second thermal conductivity different than the first thermal conductivity; and the sealed perimeter formed by the lid dam and the component dam is configured to prevent cross-migration of the first interface material toward the second interface material during curing.

2. The electronic device of claim 1, wherein:

the first interface material directly contacts the lid dam;

the component dam comprises a lateral side;

the vent extends through the lateral side of the component dam; and the lid dam is devoid of the vent.

3. The electronic device of claim 1, wherein:

the lid dam comprises a first width in a cross-sectional view;

the component dam comprises a second width in the cross-sectional view less than the first width;

the first material is different than the second material;

the difference in width exposes a portion of the component dam top side; and the first interface material contacts the portion of the component dam top side.

4. The electronic device of claim 1, wherein:
the first material and the second material are different materials;
the lid dam comprises a larger planar area than the component dam; and
the lid dam laterally extends into a portion of the second interface material.

5. The electronic device of claim 1, wherein:
the component dam comprises a first shape comprising three interconnected walls that are each directly bonded to the first electronic component and forming a C-shaped structure with an open side;
the open side defines the vent;
the lid dam comprises a second shape comprising four interconnected walls forming a closed rectangular ring; and
one of the four interconnected walls of the lid dam spans over the open side of the component dam above the vent.

6. The electronic device of claim 1, further comprising:
a lid metallization between the first interface material and the lid ceiling; and
a component metallization on the first electronic component top side between the first electronic component and the first interface material, wherein the lid metallization has a larger area than the component metallization.

7. The electronic device of claim 6, wherein:
the first interface material is an indium alloy thermal interface material; and
the second electronic component top side is devoid of any component metallization.

8. The electronic device of claim 1, wherein:
the component dam is a printed structure; and
the lid dam is a film structure.

9. The electronic device of claim 1, further comprising:
a component metallization;
wherein:
the first electronic component top side comprises an outer periphery; and
the component metallization is only inside the outer periphery.

10. The electronic device of claim 1, wherein:
the component dam comprises a first lateral side that is distal to the second electronic component and a second lateral side opposite the first lateral side and proximate to the second electronic component;
the vent extends through the first lateral side of the component dam and is configured to laterally direct overflow of the first interface material away from the second electronic component; and
the second lateral side and the lid dam together form a continuous barrier configured to physically separate the first interface material from the second interface material and to restrict the overflow of the first interface material toward the second interface material during curing.

11. The electronic device of claim 10, wherein:
the second interface material contacts the second lateral side of the component dam and the lid dam.

12. The electronic device of claim 1, wherein:
the first interface material comprises a metal thermal interface material and the first thermal conductivity is greater than 10 W/mK; and
the second interface material comprises a polymer thermal interface material and the second thermal conductivity type-less than 5 W/mK.

13. An electronic device, comprising:
a substrate comprising a substrate top side, a substrate bottom side opposite to the substrate top side and comprising a substrate dielectric structure and a substrate conductive structure;
a first electronic component coupled to the substrate conductive structure at the substrate top side and comprising a first electronic component top side distal to the substrate top side;
a second electronic component coupled to the substrate conductive structure at the substrate top side, laterally spaced apart from the first electronic component, and comprising a second electronic component top side distal to the substrate top side;
a component dam coupled to the first electronic component top side and defining a component dam cavity, wherein the component dam comprises a component dam top side;
an enclosure coupled to the substrate and over the first electronic component and the second electronic component, the enclosure comprising:
an enclosure ceiling;
an enclosure wall extending from the enclosure ceiling and defining an enclosure periphery; and
an enclosure dam within the enclosure periphery and coupled to the enclosure ceiling and the component dam and defining an enclosure dam cavity, wherein the enclosure dam comprises enclosure dam bottom side;
a first interface material over the first electronic component top side and within the component dam cavity and the enclosure dam cavity; and
a second interface material over the second electronic component top side;
wherein:
the first interface material comprises a first thermal conductivity;
the second interface material comprises a second thermal conductivity different than the first thermal conductivity;
the enclosure dam comprises a larger planar area than the component dam and the enclosure dam is vertically aligned with and vertically overlaps the component dam to form a nested enclosure;
the enclosure dam laterally extends into a portion of the second interface material; and
the enclosure dam bottom side is attached to the component dam top side such that the enclosure dam and the component dam form a continuous barrier configured to physically separate the first interface material from the second interface material and to restrict overflow of the first interface material toward the second interface material during curing.

14. The electronic device of claim 13, further comprising:
a vent;
wherein:
the component dam comprises a first lateral side that is distal to the second electronic component and a second lateral side opposite the first lateral side and proximate to the second electronic component;
the vent extends through the first lateral side of the component dam and is configured to laterally direct the overflow of the first interface material away from the second electronic component;
the enclosure dam is devoid of the vent; and
the second lateral side and the enclosure dam together form the continuous barrier.

15. The electronic device of claim 13, further comprising:

an enclosure metallization within the enclosure dam cavity; and a component metallization on the first electronic component top side between the first electronic component and the first interface material, wherein:

the second electronic component top side is devoid of any component metallization; and the enclosure metallization has a larger area than the component metallization.

16. The electronic device of claim 13, wherein:

the first interface material comprises a metal interface material;

the second interface material comprises a polymer interface material;

the first thermal conductivity is greater than 10 W/mK; and the second thermal conductivity is less than 5 W/mK.

17. A method of manufacturing an electronic device, comprising:

providing a substrate comprising a substrate top side, a substrate bottom side opposite to the substrate top side and comprising a substrate dielectric structure and a substrate conductive structure;

coupling a first electronic component to the substrate conductive structure at the substrate top side, the first electronic component comprising a first electronic component top side distal to the substrate top side and a component dam coupled to the first electronic component top side that defines a component dam cavity, wherein the component dam comprises a component dam top side;

coupling a second electronic component to the substrate conductive structure at the substrate top side, laterally spaced apart from the first electronic component, and comprising a second electronic component top side distal to the substrate top side devoid of any dam structure;

providing a first interface material over the first electronic component top side and within the component dam cavity;

providing a second interface material over the second electronic component top side;

providing an enclosure comprising:

an enclosure ceiling;

an enclosure wall extending from the enclosure ceiling and defining an enclosure periphery; and an enclosure dam within the enclosure periphery and coupled to the enclosure ceiling and the component dam and defining an enclosure dam cavity, wherein the enclosure dam comprises an enclosure dam bottom side;

coupling the enclosure to the substrate over the first electronic component and the second electronic component; and curing the first interface material and the second interface material;

wherein:

the first interface material comprises a first thermal conductivity;

the second interface material comprises a second thermal conductivity different than the first thermal conductivity;

the enclosure dam comprises a larger planar area than the component dam and the enclosure dam is vertically aligned with and vertically overlaps the component dam to form a nested enclosure;

the enclosure dam laterally extends into a portion of the second interface material; and the enclosure dam bottom side is attached to the component dam top side such that the enclosure dam and the component dam form a continuous barrier configured to physically separate the first interface material from the second interface material and to restrict overflow of the first interface material toward the second interface material during the curing.

18. The method of claim 17, wherein:

providing the first interface material comprises providing a metal thermal interface material and the first thermal conductivity is greater than 10 W/mK; and providing the second interface material comprises providing a polymer interface material and the second thermal conductivity is less than 5 W/mK.

19. The method of claim 17, wherein:

coupling the first electronic component comprises providing the component dam comprising:

a first lateral side that is distal to the second electronic component and a second lateral side opposite the first lateral side and proximate to the second electronic component; and a vent extending through the first lateral side of the component dam and configured to laterally direct the overflow of the first interface material away from the second electronic component; and the second lateral side and the enclosure dam together form the continuous barrier.

20. The method of claim 17, wherein:

coupling the first electronic component comprises coupling the first electronic component having a component metallization over the first electronic component top side;

coupling the second electronic component comprises coupling the second electronic component devoid of any component metallization over the second electronic component top side;

providing the enclosure comprises providing an enclosure metallization within the enclosure dam cavity; and the enclosure metallization has a larger area than the component metallization.

* * * * *